(12) United States Patent
Scanlan et al.

(10) Patent No.: US 10,373,870 B2
(45) Date of Patent: Aug. 6, 2019

(54) SEMICONDUCTOR DEVICE AND METHOD OF PACKAGING

(71) Applicant: DECA Technologies Inc., Tempe, AZ (US)

(72) Inventors: Christopher M. Scanlan, Chandler, AZ (US); Timothy L. Olson, Phoenix, AZ (US)

(73) Assignee: Deca Technologies Inc., Tempe, AZ (US)

( * ) Notice: Subject to any disclaimer, the term of this patent is extended or adjusted under 35 U.S.C. 154(b) by 0 days.

(21) Appl. No.: 15/967,536

(22) Filed: Apr. 30, 2018

(65) Prior Publication Data

US 2018/0254216 A1    Sep. 6, 2018

Related U.S. Application Data

(60) Continuation-in-part of application No. 15/695,772, filed on Sep. 5, 2017, now abandoned, which is a
(Continued)

(51) Int. Cl.
*H01L 23/00* (2006.01)
*H01L 21/78* (2006.01)
(Continued)

(52) U.S. Cl.
CPC ............ *H01L 21/78* (2013.01); *H01L 21/561* (2013.01); *H01L 21/565* (2013.01);
(Continued)

(58) Field of Classification Search
CPC ............ H01L 23/3107; H01L 23/3121; H01L 23/5389; H01L 2224/13024;
(Continued)

(56) References Cited

U.S. PATENT DOCUMENTS 4,687,693 A    8/1987  Sheyon et al.
4,740,414 A    4/1988  Shaheen
(Continued)

FOREIGN PATENT DOCUMENTS

EP    1229577         8/2002
JP    H03255970 A    11/1991
(Continued)

OTHER PUBLICATIONS

Kwak, Hocheol and Hubing. Todd, An Overview of Advanced Electronic Packaging Technology, May 1, 2007.
(Continued)

*Primary Examiner* — Michael M Trinh
(74) *Attorney, Agent, or Firm* — Booth Udall Fuller, PLC

(57) ABSTRACT

A semiconductor device may comprise a semiconductor die comprising an active surface and contact pads disposed. Conductive interconnects comprising first ends may be coupled to the contact pads and second ends may be disposed opposite the first ends. An encapsulant may comprise a planar surface disposed over the active surface of the semiconductor die. The planar surface may be offset from the second surface of the conductive interconnects by a distance greater than or equal to 1 micrometer. A build-up interconnect layer may be disposed over the planar surface and extend into the openings to electrically connect with the conductive interconnects. A method of making the semiconductor device may further comprise grinding a surface of the encapsulant to form the planar surface and the conductive residue across the planar surface. The conductive residue may be etched to remove the conductive residue and to reduce a height of the conductive interconnects.

20 Claims, 9 Drawing Sheets

Related U.S. Application Data continuation of application No. 15/292,082, filed on Oct. 12, 2016, now Pat. No. 9,754,835, which is a continuation-in-part of application No. 14/930,514, filed on Nov. 2, 2015, now Pat. No. 9,576,919, which is a continuation-in-part of application No. 14/642,531, filed on Mar. 9, 2015, now Pat. No. 9,177,926, and a continuation-in-part of application No. 14/584,978, filed on Dec. 29, 2014, now Pat. No. 9,337,086, which is a continuation of application No. 14/024,928, filed on Sep. 12, 2013, now Pat. No. 8,922,021, which is a continuation of application No. 13/632,062, filed on Sep. 30, 2012, now Pat. No. 8,535,978, which is a continuation-in-part of application No. 13/341,654, filed on Dec. 30, 2011, now Pat. No. 8,604,600, said application No. 15/292,082 is a continuation-in-part of application No. 14/261,265, filed on Apr. 24, 2014, now abandoned, which is a division of application No. 12/985,212, filed on Jan. 5, 2011, now abandoned.

(60) Provisional application No. 61/672,860, filed on Jul. 18, 2012, provisional application No. 61/305,122, filed on Feb. 16, 2010, provisional application No. 61/950,743, filed on Mar. 10, 2014.

(51) Int. Cl.

| | | |
|---|---|---|
| *H01L 23/48* | (2006.01) | |
| *H01L 21/56* | (2006.01) | |
| *H01L 23/498* | (2006.01) | |
| *H01L 21/768* | (2006.01) | |
| *H01L 23/29* | (2006.01) | |
| *H01L 23/31* | (2006.01) | |
| *H01L 21/304* | (2006.01) | |

(52) U.S. Cl.
CPC ...... *H01L 21/568* (2013.01); *H01L 21/76877* (2013.01); *H01L 23/48* (2013.01); *H01L 23/49827* (2013.01); *H01L 24/02* (2013.01); *H01L 24/05* (2013.01); *H01L 24/13* (2013.01); *H01L 24/19* (2013.01); *H01L 24/20* (2013.01); *H01L 24/92* (2013.01); *H01L 24/96* (2013.01); *H01L 21/304* (2013.01); *H01L 23/295* (2013.01); *H01L 23/3114* (2013.01); *H01L 23/3128* (2013.01); *H01L 23/3164* (2013.01); *H01L 23/562* (2013.01); *H01L 24/03* (2013.01); *H01L 24/11* (2013.01); *H01L 24/94* (2013.01); *H01L 2224/0231* (2013.01); *H01L 2224/0239* (2013.01); *H01L 2224/02311* (2013.01); *H01L 2224/02313* (2013.01); *H01L 2224/02331* (2013.01); *H01L 2224/02377* (2013.01); *H01L 2224/03* (2013.01); *H01L 2224/0345* (2013.01); *H01L 2224/03452* (2013.01); *H01L 2224/03462* (2013.01); *H01L 2224/03464* (2013.01); *H01L 2224/0401* (2013.01); *H01L 2224/04105* (2013.01); *H01L 2224/05008* (2013.01); *H01L 2224/05024* (2013.01); *H01L 2224/0558* (2013.01); *H01L 2224/05147* (2013.01); *H01L 2224/05166* (2013.01); *H01L 2224/05548* (2013.01); *H01L 2224/05569* (2013.01); *H01L 2224/05572* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05669* (2013.01); *H01L 2224/05671* (2013.01); *H01L 2224/05687* (2013.01); *H01L 2224/11* (2013.01); *H01L 2224/1132* (2013.01); *H01L 2224/1145* (2013.01); *H01L 2224/11334* (2013.01); *H01L 2224/11452* (2013.01); *H01L 2224/11462* (2013.01); *H01L 2224/11464* (2013.01); *H01L 2224/11849* (2013.01); *H01L 2224/11901* (2013.01); *H01L 2224/12105* (2013.01); *H01L 2224/131* (2013.01); *H01L 2224/13024* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/19* (2013.01); *H01L 2224/2101* (2013.01); *H01L 2224/214* (2013.01); *H01L 2224/215* (2013.01); *H01L 2224/32225* (2013.01); *H01L 2224/73267* (2013.01); *H01L 2224/92* (2013.01); *H01L 2224/94* (2013.01); *H01L 2224/95001* (2013.01); *H01L 2224/96* (2013.01); *H01L 2924/00* (2013.01); *H01L 2924/00014* (2013.01); *H01L 2924/014* (2013.01); *H01L 2924/0105* (2013.01); *H01L 2924/01013* (2013.01); *H01L 2924/01023* (2013.01); *H01L 2924/01028* (2013.01); *H01L 2924/01029* (2013.01); *H01L 2924/01047* (2013.01); *H01L 2924/01074* (2013.01); *H01L 2924/01079* (2013.01); *H01L 2924/01082* (2013.01); *H01L 2924/04941* (2013.01); *H01L 2924/12041* (2013.01); *H01L 2924/12042* (2013.01); *H01L 2924/13091* (2013.01); *H01L 2924/181* (2013.01); *H01L 2924/18161* (2013.01); *H01L 2924/18162* (2013.01); *H01L 2924/3511* (2013.01); *Y02P 80/30* (2015.11)

(58) Field of Classification Search
CPC . H01L 2224/12105; H01L 2224/02331; H01L 2224/32225; H01L 2224/96; H01L 2224/97; H01L 24/96; H01L 24/81; H01L 24/82; H01L 24/16; H01L 21/561; H01L 21/568; H01L 21/78
See application file for complete search history.

(56) References Cited

U.S. PATENT DOCUMENTS

| | | | |
|---|---|---|---|
| 4,894,115 | A | 1/1990 | Eichelberger et al. |
| 5,161,093 | A | 11/1992 | Gorczyca et al. |
| 5,225,023 | A | 7/1993 | Wojnarowski et al. |
| 5,353,498 | A | 10/1994 | Fillion et al. |
| 5,546,654 | A | 8/1996 | Wojnarowski et al. |
| 5,548,091 | A | 8/1996 | Distefano et al. |
| 6,683,377 | B1 | 1/2004 | Shim et al. |
| 6,705,512 | B2 * | 3/2004 | Ho .............. B23K 20/007 228/180.5 |
| 6,905,914 | B1 | 6/2005 | Huemoeller et al. |
| 6,933,176 | B1 | 8/2005 | Kirloskar |
| 7,192,802 | B2 | 3/2007 | Stecker et al. |
| 7,192,807 | B1 | 3/2007 | Huemoeller et al. |
| 7,342,303 | B1 | 3/2008 | Berry et al. |
| 7,420,272 | B1 * | 9/2008 | Huemoeller ........ H01L 21/6835 257/700 |
| 7,456,496 | B2 | 11/2008 | Hwee et al. |
| 7,476,980 | B2 | 1/2009 | Rebibis et al. |
| 7,482,203 | B2 | 1/2009 | Song et al. |
| 7,550,857 | B1 | 6/2009 | Longo et al. |

(56) References Cited

U.S. PATENT DOCUMENTS

| | | | |
|---|---|---|---|
| 7,642,128 | B1 | 1/2010 | Lin et al. |
| 7,692,286 | B1 | 4/2010 | Huemoeller et al. |
| 7,767,496 | B2 | 8/2010 | Shim |
| 7,777,351 | B1 | 8/2010 | Berry et al. |
| 7,829,380 | B2 | 11/2010 | Irsigler et al. |
| 7,843,052 | B1 | 11/2010 | Yoo et al. |
| 7,932,595 | B1 | 4/2011 | Huemoeller et al. |
| 8,030,770 | B1 | 10/2011 | Juskey et al. |
| 8,119,455 | B1 | 2/2012 | Huemoeller et al. |
| 8,237,259 | B2 | 8/2012 | Pressel et al. |
| 8,288,209 | B1 | 10/2012 | Chi et al. |
| 8,298,866 | B1 | 10/2012 | Huemoeller et al. |
| 8,436,255 | B2 | 5/2013 | Goh |
| 8,486,764 | B1 | 7/2013 | Huemoeller et al. |
| 8,487,435 | B2 | 7/2013 | Juskey et al. |
| 8,653,674 | B1 | 2/2014 | Darveaux et al. |
| 8,691,632 | B1 | 4/2014 | Huemoeller et al. |
| 8,710,649 | B1 | 4/2014 | Huemoeller et al. |
| 8,778,738 | B1 * | 7/2014 | Lin .................. H01L 23/49838 438/118 |
| 2003/0027373 | A1 | 2/2003 | Distefano et al. |
| 2003/0092217 | A1 | 5/2003 | Coyle |
| 2003/0164554 | A1 | 9/2003 | Fee et al. |
| 2004/0113283 | A1 | 6/2004 | Farnsworth |
| 2005/0208700 | A1 | 9/2005 | Kwon et al. |
| 2006/0275949 | A1 | 12/2006 | Farnworth et al. |
| 2006/0291029 | A1 | 12/2006 | Lin et al. |
| 2007/0079986 | A1 | 4/2007 | Kikuchi et al. |
| 2007/0152314 | A1 | 7/2007 | Manepalli et al. |
| 2008/0237828 | A1 | 10/2008 | Yang |
| 2009/0017024 | A1 | 1/2009 | Estok et al. |
| 2009/0152715 | A1 | 6/2009 | Shim et al. |
| 2009/0200665 | A1 * | 8/2009 | Jobetto ................ H01L 21/568 257/737 |
| 2009/0243097 | A1 * | 10/2009 | Koroku ................ H01L 21/561 257/737 |
| 2009/0302484 | A1 | 12/2009 | Lee et al. |
| 2010/0052135 | A1 | 3/2010 | Shim et al. |
| 2010/0148378 | A1 | 6/2010 | Katayama et al. |
| 2010/0167471 | A1 | 7/2010 | Jin et al. |
| 2010/0195299 | A1 | 8/2010 | Souriau et al. |
| 2010/0216280 | A1 | 8/2010 | Smeys et al. |
| 2010/0308474 | A1 | 12/2010 | Shibuya et al. |
| 2011/0001215 | A1 | 1/2011 | Lam |
| 2011/0042796 | A1 | 2/2011 | Chang et al. |
| 2011/0095413 | A1 | 4/2011 | Barth et al. |
| 2011/0156250 | A1 | 6/2011 | Goh et al. |
| 2011/0186977 | A1 | 8/2011 | Chi et al. |
| 2011/0193205 | A1 | 8/2011 | Hsieh |
| 2011/0202896 | A1 | 8/2011 | Scanlan et al. |
| 2011/0250396 | A1 | 10/2011 | Matsutani et al. |
| 2012/0032314 | A1 | 2/2012 | Chen et al. |
| 2012/0119373 | A1 | 5/2012 | Hunt |
| 2012/0133001 | A1 | 5/2012 | Tkaczyk et al. |
| 2013/0026658 | A1 | 1/2013 | Chen |
| 2013/0062760 | A1 | 3/2013 | Hung et al. |
| 2013/0168848 | A1 | 7/2013 | Lin et al. |
| 2013/0168849 | A1 | 7/2013 | Scanlan |
| 2013/0270682 | A1 | 10/2013 | Hu et al. |
| 2013/0307140 | A1 | 11/2013 | Huang et al. |
| 2013/0334698 | A1 | 12/2013 | Mohammed et al. |
| 2014/0042600 | A1 | 2/2014 | Kim et al. |
| 2014/0054802 | A1 | 2/2014 | Shim |
| 2014/0057394 | A1 | 2/2014 | Ramasamy et al. |

FOREIGN PATENT DOCUMENTS

| | | |
|---|---|---|
| WO | WO2009006284 | 1/2009 |
| WO | WO2009009436 | 1/2009 |
| WO | WO2010/080068 A1 | 7/2010 |
| WO | 2013103216 | 7/2013 |

OTHER PUBLICATIONS

Kripesh, Vaidyanathan et al., Design and Development of a Multi-Die Embedded Micro Wafer Level Package, Institute of Microelectronics, Singapore, 2008.

Micronews, Fan-in WLCSP matures, what's next?, 3 D Packaging Magazine, Issue 14, Feb. 2008, pp. 2-5.

Th, E.K. et al, Encapsulation Challenges for Wafer Level Packaging, Electronics Packaging Technology Conference, 2009.

R Anderson, et al., Advances in WLCSP Technologies for Growing Market Needs, SMTA's 6th AMual International Wafer Level Packaging Conference, Oct. 27-30, 2009, Santa Clara, CA.

Kanth et al., Design and Development of True-CSP, United Test & Assembly Center Ltd (UTAC), 2005, pp. 577-582.

Hunt, John, Value Engineered Wafer Level Packages for Mobile Devices, Jul. 9, 2013.

Fan et al., Design and optimization of thermo-mechanical reliability in wafer level packaging, Jul. 4, 2009.

Motohashi et al., System in Wafer-Level Package Technology with RDL-first Process, Kanagawa, Japan, 2011, pp. 59-64.

Nishio, 3D package technologies review with gap analysis for mobile application requirements, STATS ChipPAC, Japan, Apr. 22, 2014.

Krohnert et al., System-in-package (SiP) on wafer level, enabled by fan-out WLP (eWLB), Portugal, Oct. 9-11, 2012.

Flack et al., Lithography Technique to Reduce the Alignment Errors from Die Placement in Fan-out Wafer Level Packaging Applications, San Jose, CA, 2011, pp. 65-70.

Exposed, Merriam-Webster, merriam-webster.com/dictionary/exposed.

Thick Copper(Cu) RDL, Chipbond website.

Yannou, An overview of recent panel-scale packaging developments throughout the industry, MiNaPAD conference, Grenoble, Apr. 24, 2012.

WLCSP (FiWLP Technology), Wafer level chip scale package, Jul. 2014, 2 pages.

\* cited by examiner

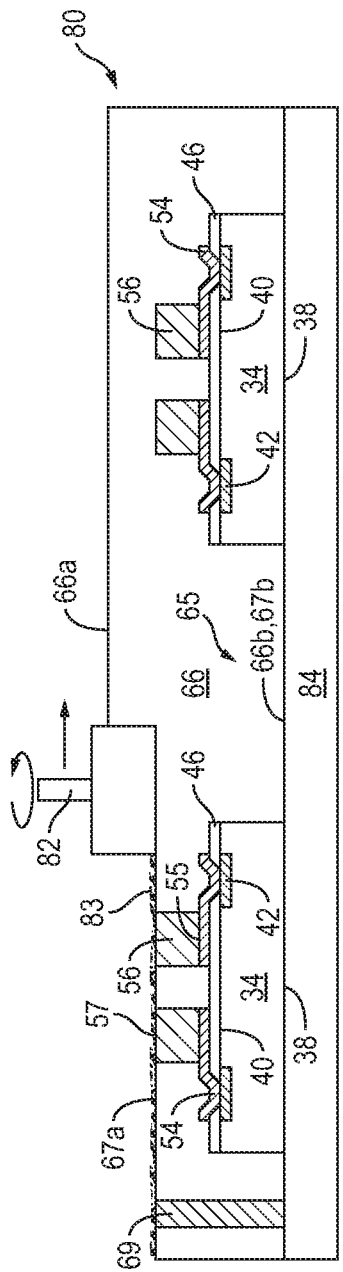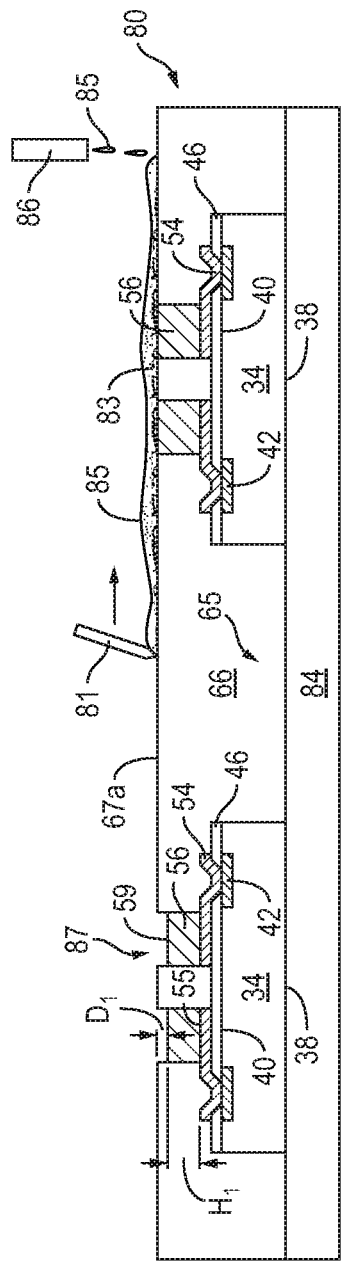

SEMICONDUCTOR DEVICE AND METHOD OF PACKAGING

RELATED APPLICATIONS

This application is a continuation-in-part application of U.S. patent application Ser. No. 15/695,772, titled "Semiconductor Device and Method Comprising Redistribution Layers," filed Sep. 5, 2017, now pending, which application is a continuation of U.S. application Ser. No. 15/292,082, titled "Semiconductor Device and Method Comprising Redistribution Layers," filed Oct. 12, 2016, now issued as U.S. Pat. No. 9,754,835, which is a continuation in part of U.S. application Ser. No. 14/930,514, titled "Semiconductor Device and Method Comprising Redistribution Layers," filed Nov. 2, 2015, now issued as U.S. Pat. No. 9,576,919, which is a continuation in part of U.S. application Ser. No. 14/642,531 entitled "Semiconductor Device and Method Comprising Thickened Redistribution Layers," which was filed on Mar. 9, 2015, now issued as U.S. Pat. No. 9,177,926, which application claims the benefit of U.S. Provisional Patent No. 61/950,743, entitled "Wafer-Level-Chip-Scale-Packages with Thick Redistribution Layer Traces," which was filed on Mar. 10, 2014, and application Ser. No. 14/642,531 is also a continuation in part of U.S. application Ser. No. 14/584,978, entitled "Die Up Fully Molded Fan-Out Wafer Level Packaging," which was filed on Dec. 29, 2014, now issued as U.S. Pat. No. 9,337,086, which application is a continuation of U.S. application Ser. No. 14/024,928, entitled "Die Up Fully Molded Fan-Out Wafer Level Packaging," which was filed on Sep. 12, 2013, now issued as U.S. Pat. No. 8,922,021, which application claims the benefit of the filing date of U.S. Provisional Patent No. 61/672,860, entitled "Fan-Out Semiconductor Package," which was filed on Jul. 18, 2012, and application Ser. No. 14/024,928 is also a continuation of U.S. application Ser. No. 13/632,062, entitled "Die Up Fully Molded Fan-Out Wafer Level Packaging," which was filed on Sep. 30, 2012, now issued as U.S. Pat. No. 8,535,978, which application is a continuation in part of U.S. application Ser. No. 13/341,654, entitled "Fully Molded Fan-Out," which was filed on Dec. 30, 2011, now issued as U.S. Pat. No. 8,604,600, the disclosures of each of which are hereby incorporated by this reference in their entireties.

TECHNICAL FIELD

The disclosure relates in general to semiconductor devices and, more particularly, to panelized packaging for the formation of molded packages or semiconductor devices, including fan-out wafer level packaging (FOWLP).

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

One approach to back-end processing that more efficiently produces packaged semiconductor devices is the use of panelized packaging, in which a number of semiconductor die are formed into a panel and processed simultaneously at a level of a reconstituted wafer or panel. One form of panelized packaging used to package semiconductor die is fan-out wafer level package (FOWLP). FOWLP involves placing multiple semiconductor die "face down" or with an active surface of the semiconductor die oriented toward a temporary carrier or substrate, such as a temporary tape carrier. The semiconductor die and substrate or carrier is overmolded with an encapsulant, such as an epoxy molding compound, using, for example, a compression molding process. After molding, the carrier tape is removed to expose the active surface of the multiple semiconductor die formed together as a reconstituted wafer. Subsequently, a wafer level chip scale package (WLCSP) build-up interconnect structure is formed on top of the reconstituted wafer. Conductive bumps are then formed over the build-up interconnect structure as a ball grid array (BGA), which is attached to the reconstituted wafer. After formation of the BGA, the reconstituted wafer is singulated to form individual semiconductor devices or packages.

SUMMARY

The foregoing and other aspects, features, and advantages will be apparent to those artisans of ordinary skill in the art from the DESCRIPTION and DRAWINGS, and from the CLAIMS.

Accordingly, in one aspect, a semiconductor device may comprise a semiconductor die comprising four side surfaces and an active surface, the semiconductor die further comprising contact pads disposed over the active surface. Conductive interconnects may comprise first ends coupled to the contact pads and second ends opposite the first ends. The second ends of the conductive interconnects may be offset from the active surface by a height of at least 8 micrometers (μm). An encapsulant may contact the four side surfaces of the semiconductor die and further comprising a planar surface disposed over the active surface of the semiconductor die. The planar surface may be offset from the active surface by more than the height of the conductive interconnects. Openings may be formed through the planar surface of the encapsulant and extend to the second ends of the conductive interconnects, the openings comprising a depth greater than or equal to 1 μm. A build-up interconnect layer may be disposed over the planar surface and extend into the openings to electrically connect with the conductive interconnects.

The semiconductor device may further comprise the conductive interconnects comprising copper studs or redistribution layer (RDL) traces. The build-up interconnect layer may comprise a RDL and conductive bumps. The planar surface may be free from a conductive residue formed by grinding the encapsulant and the conductive interconnects. A backside coating may contact a backside of the semiconductor die.

A method of making the semiconductor device of may comprise grinding a surface of the encapsulant to expose the conductive interconnects, to form the planar surface, and to form the conductive residue across the planar surface. The method may further comprise etching the conductive residue and the exposed conductive interconnects to remove the conductive residue at the planar surface and to reduce a height of the conductive interconnects to form the second ends of the conductive interconnects offset from the planar surface by a distance greater than 1 μm.

In another aspect, a semiconductor device may comprise a semiconductor die comprising four side surfaces and an active surface, the semiconductor die further comprising contact pads disposed over the active surface. Conductive interconnects may comprise first ends coupled to the contact pads and second ends opposite the first ends. An encapsulant may contact the four side surfaces of the semiconductor die and may further comprise a planar surface disposed over the active surface of the semiconductor die, the planar surface being offset from the active surface by more than the height of the conductive interconnects. Openings may be formed through the planar surface of the encapsulant and extend to the second ends of the conductive interconnects, the openings comprising a depth greater than or equal to 1 μm. A build-up interconnect layer may be disposed over the planar surface and extend into the openings to electrically connect with the conductive interconnects.

The semiconductor device may further comprise the conductive interconnects comprising copper studs or RDL traces. The build-up interconnect layer may comprise a RDL and conductive bumps. The planar surface may be free from a conductive residue formed by grinding the encapsulant and the conductive interconnects. A backside coating may contact a backside of the semiconductor die. The RDL may directly contact, and extends across, the planar surface of the encapsulant.

A method of making the semiconductor device may further comprise grinding a surface of the encapsulant to expose the conductive interconnects, to form the planar surface, and to form the conductive residue across the planar surface. The method may further comprise etching the conductive residue and the exposed conductive interconnects to remove the conductive residue at the planar surface and to reduce a height of the conductive interconnects to form the second ends of the conductive interconnects offset from the planar surface by a distance greater than 1 μm.

In another aspect, a semiconductor device may further comprise a semiconductor die comprising an active surface and contact pads disposed over the active surface. Conductive interconnects may comprise first ends coupled to the contact pads and second ends opposite the first ends. An encapsulant may comprise a planar surface disposed over the active surface of the semiconductor die, the planar surface being offset from the second surface of the conductive interconnects by a distance greater than or equal to 1 μm. A build-up interconnect layer may be disposed over the planar surface and extend into the openings to electrically connect with the conductive interconnects.

The semiconductor device may further comprise the conductive interconnects comprising copper studs or RDL traces. The build-up interconnect layer may comprise a RDL and conductive bumps. The planar surface may be free from a conductive residue formed by grinding the encapsulant and the conductive interconnects. A backside coating may contact a backside of the semiconductor die. The semiconductor die may comprise four side surfaces and the encapsulant may contact the four side surfaces.

A method of making the semiconductor device may comprise grinding a surface of the encapsulant to expose the conductive interconnects, to form the planar surface, and to form the conductive residue across the planar surface. The method may further comprise etching the conductive residue and the exposed conductive interconnects to remove the conductive residue at the planar surface and to reduce a height of the conductive interconnects to form the second ends of the conductive interconnects offset from the planar surface by a distance greater than 1 μm.

BRIEF DESCRIPTION OF THE DRAWINGS

FIGS. 2A-2J illustrate a method for forming a semiconductor device or package.

DETAILED DESCRIPTION

Embodiments of the disclosure disclose methods and systems to improve panelized packaging. In accordance with embodiments of the disclosure, misalignment for individual device units in a panel or reticulated wafer may be adjusted for by measuring the misalignment for each individual device unit and adjusting the position or design of a feature in the build-up layer for each respective device unit utilizing a mask-less patterning technique.

In the following description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGS. are illustrative representations and are not necessarily drawn to scale.

The terms "over," "between," and "on" as used herein refer to a relative position of one layer with respect to other layers. One layer deposited or disposed above or under another layer may be directly in contact with the other layer or may have one or more intervening layers. One layer deposited or disposed between layers may be directly in contact with the layers or may have one or more intervening layers. In contrast, a first layer "on" a second layer is in contact with that second layer.

Figure 1A:
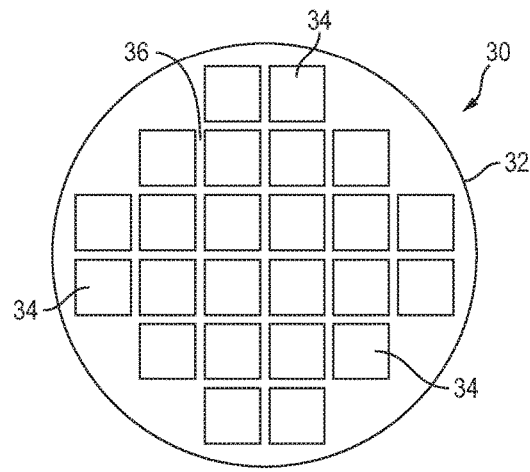
FIGS. 1A-1D illustrate semiconductor die as part of a native semiconductor wafer.

FIG. 1A shows a semiconductor wafer 30 with a base substrate material 32, such as, without limitation, silicon, germanium, gallium arsenide, indium phosphide, or silicon carbide, for structural support. A plurality of semiconductor die or components 34 is formed on wafer 30 separated by a non-active, inter-die wafer area or saw street 36 as described above. Saw street 36 provides cutting areas to singulate semiconductor wafer 30 into individual semiconductor die 34.

Figure 1B:
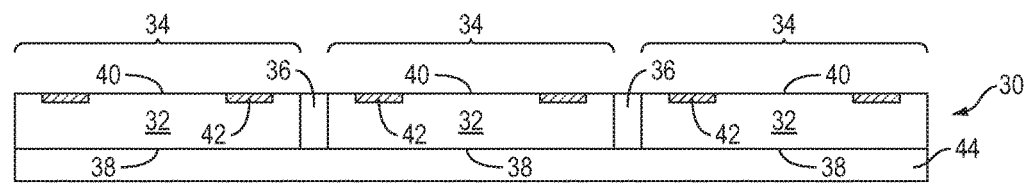

FIG. 1B shows a cross-sectional view of a portion of semiconductor wafer 30 from FIG. 1A. Each semiconductor die 34 has a backside or back surface 38 and an active surface 40 opposite the backside. Active surface 40 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 40 to implement analog circuits or digital circuits, such as DSP, ASIC, memory, or other signal processing circuit. Semiconductor die 34 may also contain IPDs such as inductors, capacitors, and resistors, for RF signal processing.

An electrically conductive layer 42 is formed over active surface 40 using PVD, CVD, electrolytic plating, electroless plating process, or other suitable metal deposition process. Conductive layer 42 can be one or more layers of aluminum (Al), copper (Cu), tin (Sn), nickel (Ni), gold (Au), silver (Ag), or other suitable electrically conductive material. Conductive layer 42 operates as contact pads or bond pads electrically connected to the circuits on active surface 40. Conductive layer 42 can be formed as contact pads disposed side-by-side a first distance from the edge of semiconductor die 34, as shown in FIG. 1B. Alternatively, conductive layer 42 can be formed as contact pads that are offset in multiple rows such that a first row of contact pads is disposed a first distance from the edge of the die, and a second row of contact pads alternating with the first row is disposed a second distance from the edge of the die.

Semiconductor wafer 30 can also undergo an optional grinding operation to planarize the backside surface 38 and reduce a thickness of the semiconductor wafer 30. Similarly, an optional chemical etch can also be used to remove and planarize semiconductor wafer 30. With wafer 30 comprising a desired thickness, an optional backside coating 44 may be formed over backside 38 of semiconductor die 34. Backside coating 44 comprises a polymer layer, dielectric film, epoxy film, or other suitable material having similar insulating and structural properties that can contain one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), polyimide, benzocyclobutene (BCB), and polybenzoxazoles (PBO). Backside coating 44 can be formed by a lamination process, molding process, or other suitable process. Alternatively, optional backside coating 44 may be omitted such that backside 38 remains exposed as part of a final package or remains exposed for subsequent encapsulation. In another embodiment, backside coating 44 is one or more layers of a thermally conductive material such as Al, Cu, and Ni, or other suitable material with high thermal conductivity that is formed by a process such as printing, PVD, CVD, sputtering, electrolytic plating, electroless plating, metal evaporation, metal sputtering, or other suitable process. Thermally conductive backside coating 44 forms a thermally conductive path that aids with distribution and dissipation of heat generated by semiconductor die 34 and increases the thermal performance of the subsequently formed semiconductor device, package, or FOWLP 100. While backside coating 44 is shown in FIG. 1B as being formed on backside 38 of semiconductor wafer 30 before the wafer is singulated into individual semiconductor die 34, backside coating 44 can also be formed on individual semiconductor die 34 after singulation.

Figure 1C:
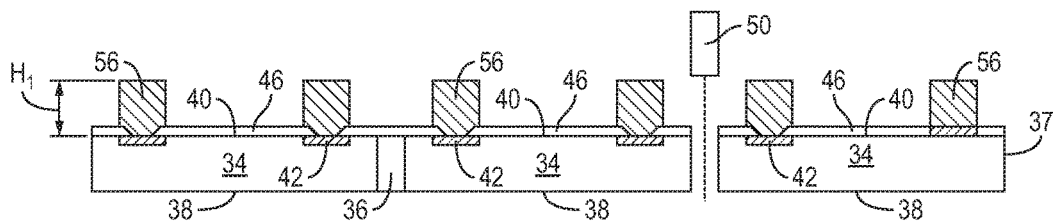

FIG. 1C shows semiconductor wafer 30 without optional backside coating 44, although the processes and structures shown in subsequent FIGS. can also be performed with backside coating 44 being present. FIG. 1C also shows an insulating or passivation layer 46 conformally applied over active surface 40 and over conductive layer 42. Insulating layer 46 includes one or more layers that are applied using PVD, CVD, screen printing, spin coating, spray coating, sintering, or thermal oxidation. Insulating layer 46 contains one or more layers of $SiO_2$, $Si_3N_4$, SiON, $Ta_2O_5$, $Al_2O_3$, polyimide, BCB, PBO or other material having similar insulating and structural properties. In an embodiment, passivation layer 46 includes a passivation layer formed over active surface 40 and an optional polymer layer formed over the passivation layer and over conductive layer 42. Openings are formed completely through insulating layer 46 to expose at least a portion of conductive layer 42 for subsequent electrical connection. Alternatively, because insulating layer 46 is optional, conductive layer 42 is exposed for subsequent electrical interconnection in the absence of forming the insulating layer.

Conductive interconnects or electrical interconnects 56, which may include studs, bumps, posts, pillars, columns, studs, Cu studs, RDL traces, or Cu RDL traces, are formed over, and connected to, conductive layer 42. Interconnects 56 can be formed directly on conductive layer 42 using patterning and metal deposition processes such as printing, PVD, CVD, sputtering, electrolytic plating, electroless plating, metal evaporation, metal sputtering, or other suitable metal deposition process. Electrical interconnects 56 can be one or more layers of Al, Cu, Sn, Ni, Au, Ag, palladium (Pd), or other suitable electrically conductive material, and can include one or more UBM layers. In an embodiment, a photoresist layer is deposited over semiconductor die 34 and conductive layer 42. A portion of the photoresist layer is exposed and removed by an etching development process. Electrical interconnects 56 are formed as copper studs, bumps, pillars, posts, or columns in the removed portion of the photoresist and over conductive layer 42 using a selective plating process. The photoresist layer is removed leaving interconnects 56 that provide for subsequent electrical interconnection and a standoff with respect to active surface 40 and insulating layer 46, if present. Interconnects 56 may include a height H1 greater than 8 µm, or in a range of 8-40 µm, 15-25 µm, or a height of about 20 µm.

Figure 1D:
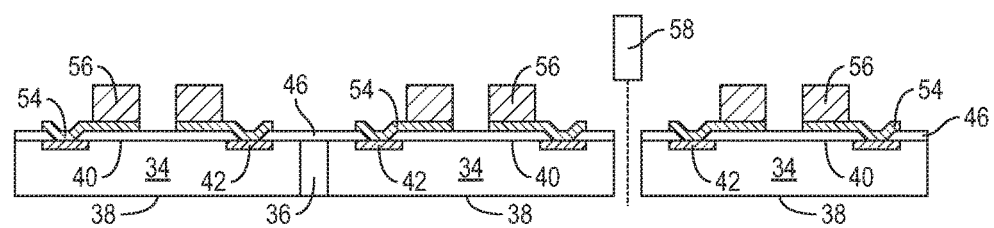

FIG. 1D, similar to FIG. 1C, shows a variation of semiconductor wafer 30 without optional backside coating 44 and with the optional insulating or passivation layer 46. FIG. 1D differs from FIG. 1C by inclusion of conductive layer 54. Electrically conductive layer or RDL 54 may be formed over insulating layer 46 and conductive layer 42 using a patterning and metal deposition process such as printing, PVD, CVD, sputtering, electrolytic plating, electroless plating, metal evaporation, metal sputtering, or other suitable metal deposition process. Conductive layer 54 may be one or more layers of Al, Cu, Sn, Ni, Au, Ag, or other suitable electrically conductive material. In an embodiment, conductive layer 54 is an RDL comprising a titanium tungsten (TiW) seed layer, a Cu seed layer, and Cu layer formed over the TiW seed layer and the Cu seed layer. Conductive layer 54 follows the contours of conductive layer 42 and insulating layer 46 or semiconductor die 34. Conductive layer 54 provides electrical paths between portions of conductive layer 42 and electrical interconnects or copper studs, bumps, posts, pillars, or columns 56. Portions of conductive layer 54 can be electrically common or electrically isolated depending on the design and function of the later mounted semiconductor die. Conductive layer 54 may operate as a fan-in RDL that provides additional flexibility in determining a position of electrical interconnects 56.

As such, conductive interconnects 56 may be formed over, and directly connected to, conductive layer 54, as shown in FIG. 1D, or to conductive layer 42 as shown in FIG. 1C. After the formation of interconnects 56, semiconductor wafer 30 may be singulated through saw street 36 using a saw blade or laser cutting tool 58 into individual semiconductor die 34.

Figure 2A:
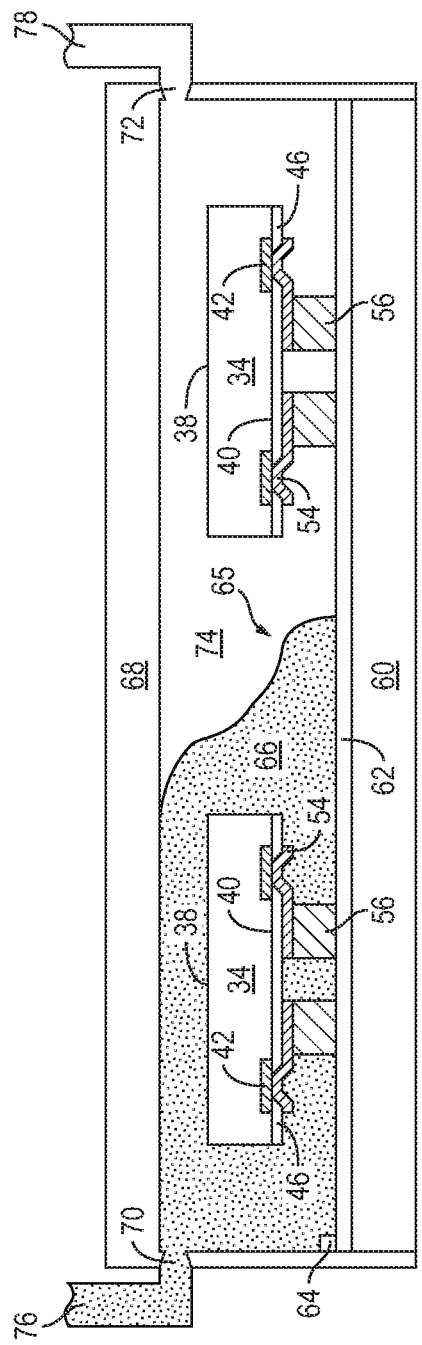

FIG. 2A shows a temporary carrier or substrate 60 containing temporary or sacrificial base material such as metal, silicon, polymer, beryllium oxide, or other suitable low-cost, rigid material for structural support. An optional interface layer or double-sided tape 62 is formed over carrier 60 as a temporary adhesive bonding film or etch-stop layer. A number of fiducial alignment marks 64 may be positioned over or attached to carrier 60 or interface layer 62. Alternatively, a portion of carrier 60 or interface layer 62 may be removed or marked to form fiducial 64. Fiducial 64 allows for orientation and handling of carrier 60 with respect to the subsequent mounting of semiconductor die 34.

FIG. 2A further shows semiconductor die 34 from FIG. 1D mounted face down to carrier 60 and interface layer 62 with active surface 40 oriented towards the substrate. Alternatively, semiconductor die 34 from FIG. 1C can also be mounted face down to carrier 60 and interface layer 62 and undergo the processing described with respect to FIGS. 2C to 2J. Semiconductor die 34 may be positioned with respect to fiducial 64 according to a nominal or predetermined position and spacing for the semiconductor die. The nominal positions selected for each of semiconductor die 34 may be determined as part of a nominal or predetermined panel design that facilitates the formation of a final device, package, or FOWLP 100 for each semiconductor die 34. The nominal panel design provides adequate space for the formation of build-up interconnect structures 91 and for singulation of each semiconductor die 34. Accordingly, FIG. 2A shows a first semiconductor die 34 mounted or disposed over carrier 60 and a second semiconductor die 34 mounted or disposed over carrier 60, which can be measured from the fiducials 64. Semiconductor die 34 are separated by a space or gap 65 when mounted over carrier 60 that provides an area for a subsequently formed fan-out interconnect structure. A size of the gap 65 includes sufficient area for optionally mounting semiconductor devices or components within the subsequently formed FOWLPs 100.

FIG. 2A also shows an encapsulant or encapsulant material 66 is deposited using a paste printing, compressive molding, transfer molding, liquid encapsulant molding, vacuum lamination, spin coating, or other suitable applicator. Specifically, FIG. 2A shows a mold 68 with a plurality of inlets 70 and 72 brought together with carrier 60 and interface layer 62 to enclose semiconductor die 34 within the mold for subsequent encapsulation. Mold 68 is brought together by moving mold 68 around semiconductor die 34, or alternatively, by moving the semiconductor die into the mold. Mold 68 can include only a first or top portion that is brought together with carrier 60 and interface layer 62 without a second or bottom mold portion. In an embodiment, carrier 60 and interface layer 62 serve as the bottom mold portion for the subsequent encapsulation process. Alternatively, semiconductor die 34, carrier 60, and interface layer 62 may be disposed within a mold including multiple portions, such as top and bottom portions.

FIG. 2A further shows mold 68 encloses semiconductor die 34 with a cavity or open space 74. Cavity 74 extends between mold 68 to semiconductor die 34 and interface layer 62. A volume of encapsulant 66 is injected from dispenser 76 under an elevated temperature and pressure through inlet 70 into cavity 74 and over semiconductor die 34 and carrier 60. Inlet 72 can be an exhaust port with optional vacuum assist 78 for excess encapsulant 66. Encapsulant 66 can be a polymer composite material, such as epoxy resin with filler, epoxy acrylate with filler, or polymer with proper filler. The volume of encapsulant 66 is measured according to the space requirements of cavity 74 less the area occupied by semiconductor die 34 and any additional semiconductor devices that might be present. Encapsulant 66 is evenly dispersed and uniformly distributed under an elevated temperature within cavity 74 around semiconductor die 34. A viscosity of encapsulant 66 is selected for uniform coverage, for example, a lower viscosity increases the flow of the encapsulant for molding, paste printing, and spin coating. Semiconductor die 34 are embedded together in encapsulant 66 which is non-conductive and environmentally protects the semiconductor device from external elements and contaminants.

Figure 2B:
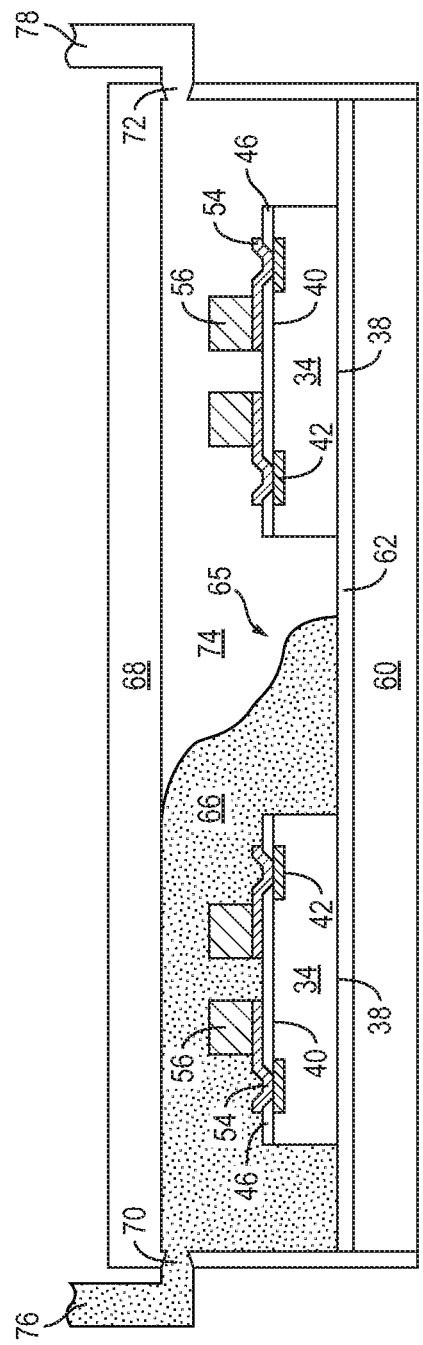

In FIG. 2B, an encapsulation process similar to the process described in relation to FIG. 2A is shown. FIG. 2B differs from FIG. 2A by the orientation of semiconductor die 34 relative to carrier 60 and interface layer 62. Instead of mounting semiconductor die 34 face down with active surface 40 oriented toward carrier 60 as shown in FIG. 2A, FIG. 2B shows an embodiment in which semiconductor die 34 are mounted face up with backsides 38 oriented toward carrier 60. Furthermore, while the processing subsequently discussed with respect to the packaging of semiconductor die 34 is shown with respect to the embodiment illustrated in FIG. 2B, the subsequent processing is likewise applicable to the embodiment shown in FIG. 2A.

In FIG. 2C, semiconductor die 34 are removed from mold 68. Carrier 60 and interface layer 62 are removed by chemical etching, mechanical peeling, CMP, mechanical grinding, thermal bake, UV light, laser scanning, wet stripping or other suitable purpose to expose encapsulant 66. A surface of encapsulant 66 may be substantially coplanar with backside 38, which is exposed by the removal of carrier 60 and interface layer 62. After removal of carrier 60 and interface layer 62, FIG. 2C shows encapsulant 66 disposed around semiconductor die 34 to form an embedded die panel 80. Panel 80 includes a footprint or form factor of any shape and size that allows for, and facilitates, the subsequent processing required to form FOWLPs 100 as described in greater detail below. In an embodiment, panel 80 includes a form factor similar to the form factor of a 300 mm semiconductor wafer and includes a circular footprint having a diameter of 300 mm. In other instances, alternative panel formats or shapes, such as rectangular or square shapes may be utilized. Other sizes of panel 80 can also be used.

As shown in FIG. 2C, an optional backside coating 84, similar to backside coating 44 in FIG. 1B, may be formed over backside 38 of semiconductor die 34 and over a surface of encapsulant 66 that is substantially coplanar with backside 38. Backside coating 84 may be a polymer layer, dielectric film, epoxy film, or other suitable material having similar insulating and structural properties that can contain one or more layers of SiO2, Si3N4, SiON, Ta2O5, Al2O3, polyimide, BCB, and PBO. Backside coating 84 can be formed by a lamination process, molding process, or other suitable process. In an embodiment, backside coating 84 is an optically transparent material that facilitates optical scanning of objects within panel 80, such as semiconductor die 34, interconnects 56, and fiducials 64. In another embodiment, backside coating 84 is one or more layers of a thermally conductive material such as Al, Cu, Ni, Cu and Ni, or other suitable material with high thermal conductivity that is formed by a process such as printing, PVD, CVD, sputtering, electrolytic plating, electroless plating, metal evaporation, metal sputtering, or other suitable process. Thermally conductive backside coating 84 forms a thermally conductive path that aids with distribution and dissipation of heat generated by semiconductor die 34 and increases the thermal performance of the subsequently formed FOWLPs 100. Alternatively, optional backside coating 84 is omitted such that backside 38 remains exposed as part of a final package. Backside coating 84 can be formed on panel 80 before or after a portion of encapsulant 66 is removed from the panel.

FIG. 2C also shows panel 80 may undergo a mechanical grinding operation with grinder 82 to planarize the surface and reduce a thickness of the panel 80. A chemical etch can also be used to remove and planarize a portion of encapsulant 66 in panel 80. When grinding occurs at the front side 66a of encapsulant 66, over active surface 40 of semiconductor die 32, encapsulant 66 may be removed until planar ends 57 of electrical interconnects 56 are exposed with respect to the encapsulant 66, and are available for subsequent electrical interconnection, with e.g., a subsequently formed build-up interconnect structure 91. As such, the planar ends 57 of the electrical interconnects 56 may be level, flush, or coplanar with the planar surface or post-grind frontside surface 66a of encapsulant 66. Furthermore, in some instances, a contrast in color between the encapsulant 66 and the electrical interconnects 56 can provide an optical signal of when sufficient grinding with the grinder 82 has occurred, because the planar ends 57 of the electrical interconnects 56 will be visible when exposed from the encapsulant and ready for subsequent electrical interconnection.

During the grinding process or grinding of the molded panel 80 with grinder 82, a conductive residue 83 can be formed across the planar surface 66a, and be located above, on, or partially embedded within, the planar surface 66a. The conductive reside 83 can comprise small particles or bits of conductive material, such as copper flakes or particles, that are removed from the conductive interconnects 56 in exposing or forming the planar ends 57 of the conductive interconnects 56. The conductive reside 83 can be transferred or smeared by the grinder 82 across the planar surface 66a when the grinder contacts both the encapsulant 66 and the conductive interconnects 56. The grinding process can smear conductive material from the conductive interconnects 56, such as Cu, and the conductive residue 83, can cause a leakage current that can cause a failure under high voltage test conditions, such as biased Highly Accelerated Stress Test (HAST) testing, or failure during performance or operation of the completed semiconductor device, package, or FOWLP 100.

In some instances, one or more additional vertical electrical interconnects 69 may be formed or disposed in a periphery of, or offset from, the semiconductor die 34, and can extend completely through the encapsulant 66, such as from front side 66a to the back side 66b of the encapsulant, to provide through vertical interconnection for the package 100 and facilitate subsequent stacking of packages, or package-on-package (PoP) designs. In such instances, and when otherwise desirable, both the front side 66a and the back side 66b of the encapsulant 66 may undergo a grinding process, such as with grinder 82, to produce post grind front side 67a and post grind back side 67b that may be coplanar with, and expose, the vertical electrical interconnects 69. An example of a vertical electrical interconnects 69 is shown for reference in FIG. 2C, and for simplicity is omitted from the other FIGS., while a person of ordinary skill in the art (POSA) will understand such vertical electrical interconnects 69 can nevertheless be present in any of the embodiments shown or described.

FIG. 2D shows that after grinding or removal of a portion of the encapsulant 66 at the front side 66a over the electrical interconnects 56, planar ends 57 of the conductive interconnects 56 can be exposed from, and be coplanar with, the planar surface 67a of the encapsulant 66. Then, after mechanically grinding the panel 80 to expose the planar ends 57 of the conductive interconnects 56, an etching step may be performed in which an etchant 85 is dispensed by an etchant dispenser 86 over, on, or directly contacting, the front side 66a of the encapsulant 60 to etch or remove the conductive residue 83. The etchant 85 can be any suitable or known etchant for etching or removing a conductive material, such as copper, and can include, without limitation, ammonium hydroxide, nitric acid, and ferric chloride.

At a same time, or near a same time, the etchant 85 can or will also remove a portion of the conductive interconnects 56 to remove the planar ends 57 and form or expose the second end, etched end, or recessed end 59 of the conductive interconnects 56. The second ends 59 of the conductive interconnects 56 are lower than the planar surface 67a of the encapsulant 66, and the second ends 59 are offset from the planar surface 67a by a first distance D1 that is equal to or greater than 1 µm. In some instances, the distance D1 will be in a range of 1-20 µm, 1-10 µm, 1-5 µm, 0-2 µm, or less than 5 µm. The planar surface 67a containing the conductive residue 83 can be exposed to etchant until the distance D1 is at least 1 µm, 1-2 µm, 2-5 µm, or greater than 4 µm, which can be for any suitable amount of time, and may vary depending on the strength of the etchant and other conditions. When a desired amount of etching has occurred, an etchant removal device 81 can remove the etchant to halt, stop, or end the etching. By over-etching the conductive residue 83 until the conductive interconnects have been etched below the planar surface 67a by the distance D1, the conductive residue 83 can be completely, substantially, or mostly removed from the planar surface 67a of the mold compound 66 such that the planar surface 67a is free from the conductive residue 83. As used herein, free from the conductive residue 83 may mean completely or totally free from the conductive residue 83, or substantially free from the conductive residue 83 so that trace amounts of the conductive residue 83 may be present, such as less than 5%, 1%, 0.1%, or 0.001% of the residue initially present, such as after the grinding. However, when free from conductive residue 83 includes trace amounts of the conductive residue 83, the trace amounts will be in such a small or limited quantities that the risk of a leakage current or failure during testing, such as HAST testing, is greatly reduced, such as by more than 95%, 99%, 99.99% or more, and does not pose a problem.

As a result of the etching of the conductive interconnects 56, openings or recesses 87 (comprising a depth of D1) are formed in the encapsulant 66 of the molded panel 80. The openings 87 can be formed through the planar surface 67a of the encapsulant 66 and extending to the second ends 59 of the conductive interconnects 56, the openings 87 comprising the depth D1 greater than or equal to 1 µm. Additionally, interconnects 56 may include a height H1 greater than 8 µm, or in a range of 8-40 µm, 15-25 µm, or a height of about 20 µm. The height H1 can be less or slightly less than the height H1 before etching, such as being diminished by a distance D1. After etching, conductive interconnects 56 may comprise first ends 55 coupled to the contact pads 42 of the semiconductor die 34, whether in direct contact with the contact pads 42, as shown in FIG. 1C, or whether indirectly contacting or coupled to the contact pads 42, such as through conductive layer or RDL 54, as shown in FIGS. 1D and 2D. After etching, conductive interconnects 56 may comprise second ends 59 opposite the first ends 55, the second ends 59 being offset from the active surface 40 by a height of at least 8 µm. As such, the planar surface 67a may be offset from the active surface 40 by more than the height H1 of the conductive interconnects 56 after etching.

Figure 2E:
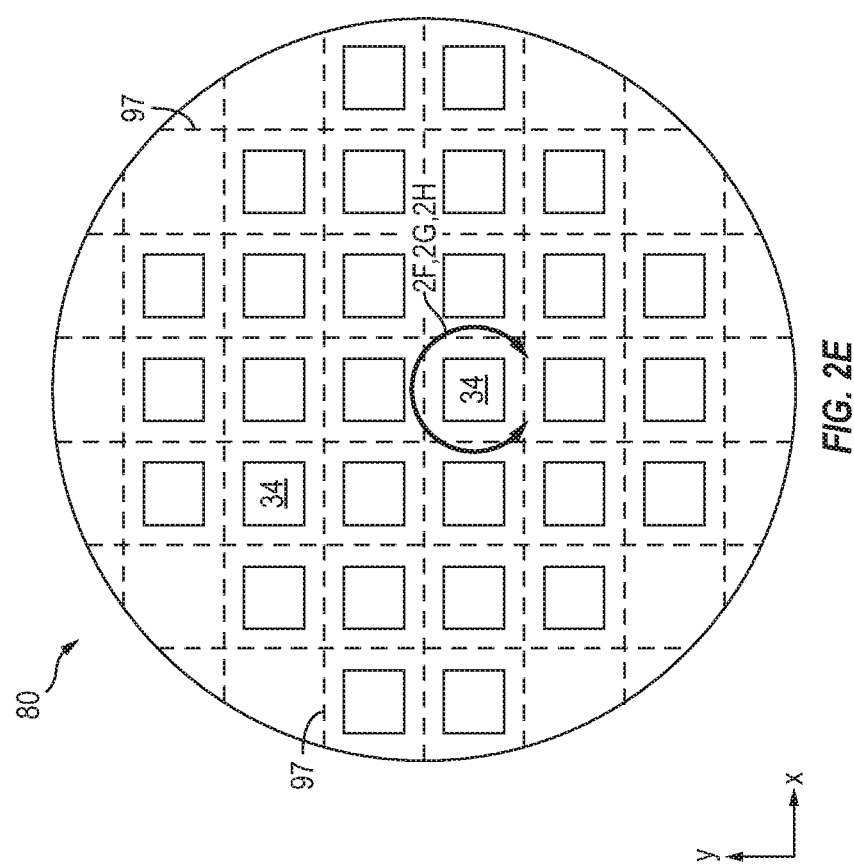
Figure 2H:
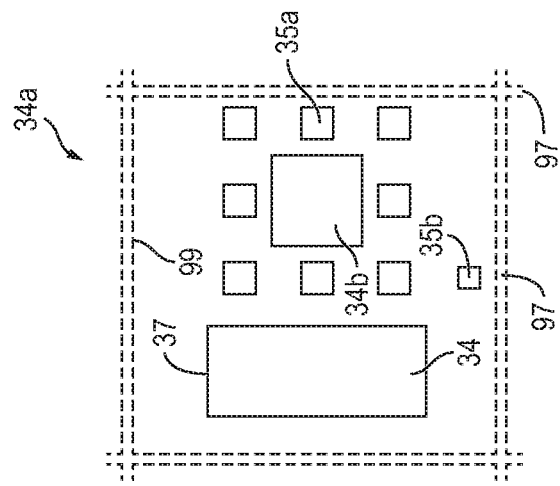
Figure 2G:
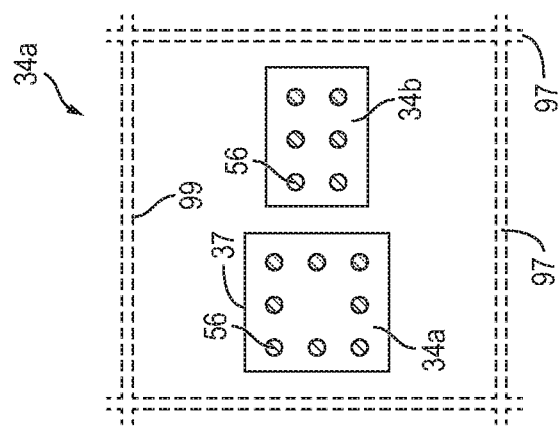
Figure 2F:
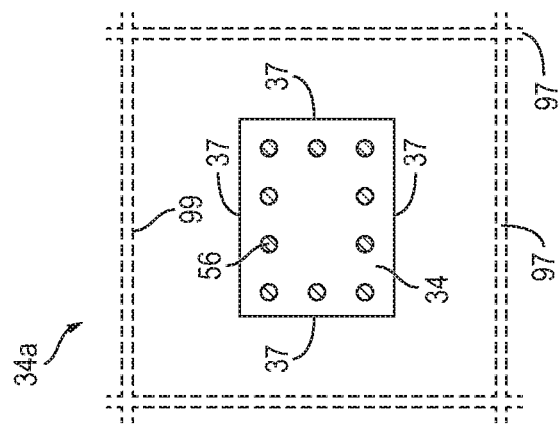

FIG. 2E, continuing from FIG. 2D, shows a plan or top view of the reconstituted panel 80 shown in the cross-sectional profile view of FIG. 2D. While FIG. 2E shows the reconstituted panel 80 comprising a circular shape, as noted above, alternative panel formats or shapes, such as rectangular or square shapes of any suitable size may be utilized. For convenience, FIG. 2E, like FIG. 2D, shows individual or single semiconductor die 34 being spaced apart within the reconstituted panel 80 for inclusion within the subsequently formed semiconductor devices, packages, or FOWLPs 100. However, a POSA will appreciate that in some instances the overmolded or encapsulated semiconductor die 34, which may be referred to as device units 34a and are shown in FIGS. 2F-2H, may include more than a single semiconductor die 34. Each of FIGS. 2F-2H is discussed below in additional detail. The close-up view of FIGS. 2F-2H are, respectively, taken along the section lines 2F, 2G, and 2H, as shown in FIG. 2E.

FIG. 2F shows the semiconductor die 34 (including conductive interconnects 56) embedded in, and surrounded by the encapsulant 66 so that the encapsulant 66 contacts four side surfaces 37 of the semiconductor die 34 and, as shown e.g. in FIGS. 2C and 2D, the planar surface 67a of encapsulant 66 is disposed over the active surface 40 of the semiconductor die 34. The planar surface 67a may be offset from the active surface 40 by more than the height H1 of the conductive interconnects 56. The device unit 34a is shown surrounded or outlined by an inter-device unit area, or saw street 97, through which the subsequent singulation occurs, as shown in FIG. 2J, that defines the package edges 99 of the semiconductor device or package 100. While conductive interconnects 56 are shown, as a non-limiting example, with a circular footprint, form factor, or cross-section, and desirable footprint, form factor, or cross-section can be used, and in instances when the conductive interconnects 56 are formed as RDL traces, the conductive interconnects 56 can be elongate and can extend across a surface of the semiconductor die 34, like conductive layer or RDL 54. When conductive interconnects 56 are formed as an RDL layer, they may replace conductive layer or RDL 54.

FIG. 2G, similar to FIG. 2F, also shows a close-up view of a portion of the reconstituted panel 80 indicated by the section line 2G in FIG. 2E. FIG. 2G differs from FIG. 2F by showing an instance in which the device unit 34a comprises a first semiconductor die 34 and a second or additional semiconductor die 34b, which can be similar or identical to the first semiconductor die 34. The semiconductor die 34 and 34b can be interconnected and coupled to each other as well as to points external to the package 100 through a subsequently formed build-up interconnect structure 91, as shown in, and described with respect to, FIGS. 2I and 2J. The device unit 34a is shown surrounded or outlined by an inter-device unit area, or saw street 97, through which the subsequent singulation occurs, as shown in FIG. 2J, that defines the package edges 99 of the semiconductor device or package 100.

FIG. 2H, similar to FIGS. 2F and 2G, also shows a close-up view of a portion of the reconstituted panel 80 indicated by the section line 2H in FIG. 2E. FIG. 2H differs from FIG. 2F by showing an instance in which the device unit 34a comprises a first semiconductor die 34 and a second or additional semiconductor die 34b, which can be similar or identical to the first semiconductor die 34. The device unit 34a in FIG. 2H further comprises passive devices 35a as well as other components 35b. The semiconductor die 34 and 34b can be interconnected and coupled to each other as well as to points external to the package 100 through a subsequently formed build-up interconnect structure 91, as shown in, and described with respect to, FIGS. 2I and 2J. The device unit 34a is shown surrounded or outlined by an inter-device unit area, or saw street 97, through which the subsequent singulation occurs, as shown in FIG. 2J, that defines the package edges 99 of the semiconductor device or package 100.

Additionally, notwithstanding the additional detail shown in FIGS. 2F-2H for the device unit 34a, the device unit 34b, passive device 35a, as well as other components 35b, for convenience and ease of description, device unit 34a, device unit 34b, passive device 35a, and other components 35b may be collectively referred to, and are shown, e.g., in FIGS. 2A-2D and 2I-11, as a semiconductor die or component 34. However, a POSA will appreciate that the illustration and recitation of a semiconductor die 34 may further comprise one or more of device unit 34a, device unit 34b, passive device 35a, and other components 35b.

Figure 2I:
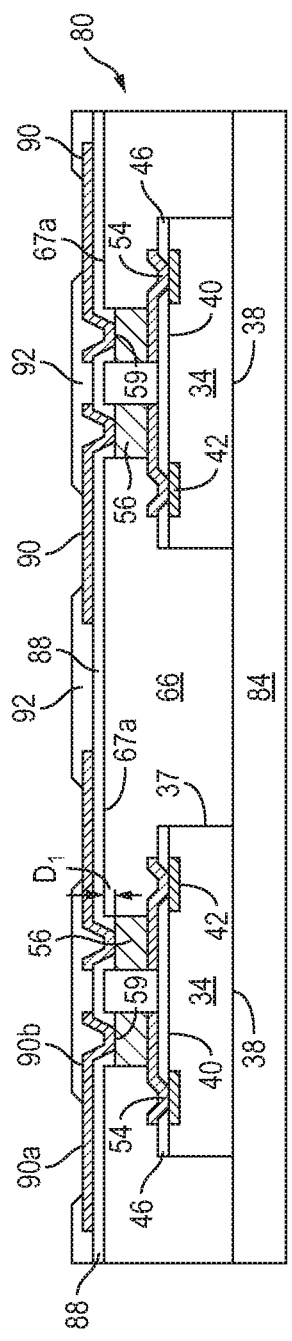
Figure 2J:
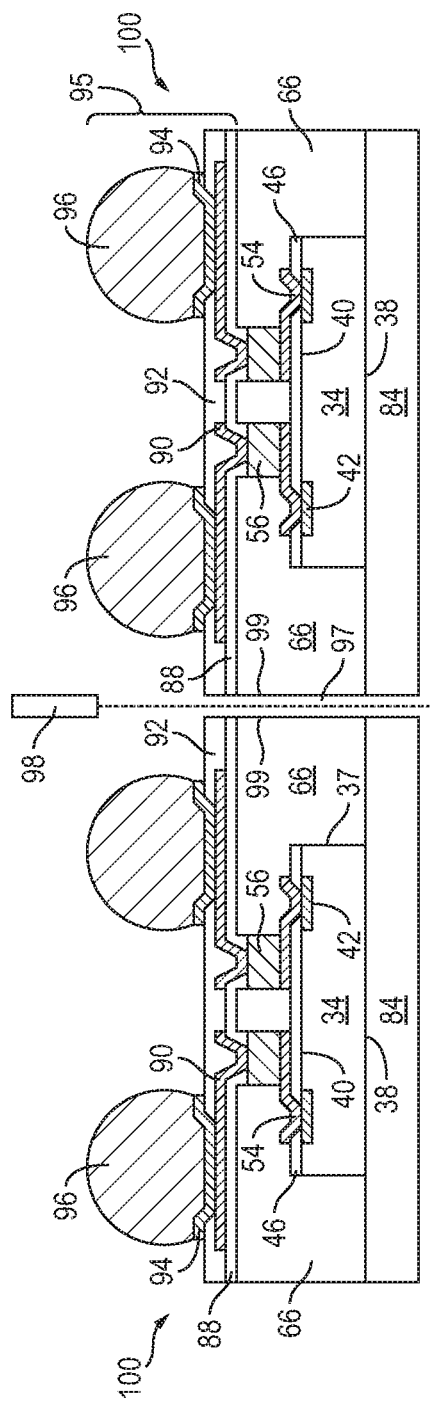

FIG. 2I shows an insulating or passivation layer 88 conformally applied over panel 80 and interconnects 56. Insulating layer 88 includes one or more layers that are applied using PVD, CVD, screen printing, spin coating, spray coating, sintering, or thermal oxidation. Insulating layer 88 contains one or more layers of SiO2, Si3N4, SiON, Ta2O5, Al2O3, polyimide, BCB, PBO or other material having similar insulating and structural properties. In an embodiment, passivation layer 88 is an optional polymer layer. Openings are formed completely through insulating layer 88 to expose at least a portion of conductive interconnect 56 for subsequent electrical connection. Alternatively, because insulating layer 88 is optional, conductive interconnect 56 may be exposed for subsequent electrical interconnection in the absence of forming the insulating layer, as shown, e.g., in FIGS. 6, 10, and 11.

FIG. 2I also shows an electrically conductive layer or RDL 90 is patterned and deposited over insulating layer 88 and interconnects 56 as a fan-out RDL. Conductive layer 90 can be one or more layers of Al, Cu, Sn, Ni, Au, Ag, or other suitable electrically conductive material. The deposition of conductive layer 90 uses PVD, CVD, electrolytic plating, electroless plating, or other suitable process. In an embodiment, conductive layer 90 is an RDL comprising a TiW seed layer, a Cu seed layer, and Cu layer formed over the TiW seed layer and the Cu seed layer. Conductive layer 90 provides electrical interconnection between electrical interconnects 56 and subsequently formed bumps or package interconnects that provide for the transmission of electrical signals between semiconductor die 34 and points external to the FOWLP 100.

FIG. 2I also shows an insulating or passivation layer 92 conformally applied over panel 80 and conductive layer 90. Insulating layer 92 includes one or more layers that are applied using PVD, CVD, screen printing, spin coating, spray coating, sintering, thermal oxidation, or other suitable practice. Insulating layer 92 may contain one or more layers of SiO2, Si3N4, SiON, Ta2O5, Al2O3, polyimide, BCB, PBO or other material having similar insulating and structural properties. In an embodiment, passivation layer 92 is a polymer layer.

In FIG. 2I, a portion of insulating layer 92 is removed by etching, laser drilling, mechanical drilling, or other suitable process to form openings completely through insulating layer 92 and to expose at least a portion of conductive layer 90 for subsequent electrical interconnection.

FIG. 2J shows UBMs 94 formed over conductive layer 90 and insulating layer 92. UBMs 94 can be multiple metal stacks including adhesion, barrier, seed, and wetting layers. Layers of UBM 94 can be Ti, TiN, TiW, Al, Cu, Cr, CrCu, Ni, NiV, Pd, Pt, Au, and Ag. In an embodiment, UBMs 94 comprise a TiW seed layer, a Cu Seed layer, and a Cu UBM layer. The TiW seed layer is conformally applied over insulating layer 92 and extends into the openings formed in insulating layer 92 and is conformally applied over a portion of conductive layer 90. The Cu seed layer is conformally applied over the TiW seed layer. The Cu UBM layer is conformally applied over the TiW seed layer and the Cu seed layer. UBMs 94 act as an intermediate conductive layer between conductive layer 90 and subsequently formed solder bumps or other I/O interconnect structures. UBMs 94 can provide a low resistive interconnect to conductive layer 90, a barrier to solder diffusion, and an increase in solder wettability.

An electrically conductive bump material is deposited over UBMs 94 and conductive layer 90 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBMs 94 using a suitable attachment or bonding process. In an embodiment, the bump material is reflowed by heating the material above its melting point to form spherical balls or bumps 96. In some applications, bumps 96 are reflowed a second time to improve electrical contact to UBMs 94. The bumps can also be compression bonded to UBMs 94. Bumps 96 represent one type of interconnect structure that can be formed over UBMs 94. The interconnect structure can also use conductive paste, stud bump, micro bump, or other electrical interconnect.

Taken together, insulating layer 88, conductive layer 90, insulating layer 92, UBMs 94, and bumps 96 may constitute a build-up interconnect structure 95 that operates to route signals from the semiconductor die 24 within the package 100 to various desired positions outside the package 100, such as through the bumps 96. While FIG. 2J shows an embodiment in which one RDL layer 90 is used, additional RDL layers, such as two, three, or more RDL layers may be used as part of build-up interconnect structure 95 depending on the complexity, configuration, and design of the package 100 and its signal routing.

After the formation of bumps 96, panel 80 is singulated between semiconductor die 34, along or within saw streets 97 using a saw blade or laser cutting tool 98 to form individual FOWLPs 100.

Figure 3:
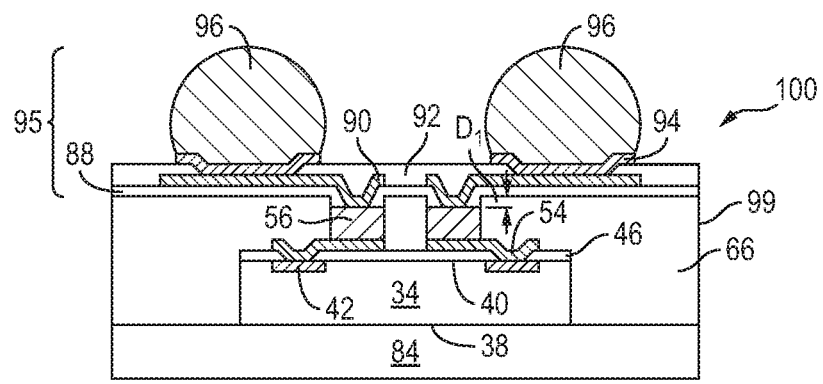
FIGS. 3-11 illustrate various embodiments of a semiconductor device or package.

FIG. 3, continuing from FIG. 2J, shows a completed device or FOWLP 100. Semiconductor device 100 includes semiconductor die 34 with optional insulating layer 46, such as polymer, disposed over active surface 40 of the semiconductor die 34. Conductive layer 54 is formed as a fan-in interconnect structure that connects to contact pads 42 and conductive interconnects or copper studs 56. Semiconductor die 34, conductive layer or fan-in RDL 54, and interconnect structures 56 are encapsulated with encapsulant 66. Backside coating 84 may be disposed over and contact backside 38 of the semiconductor die 34 and encapsulant 66 formed around a periphery of semiconductor die 34. Backside coating 84 may include a footprint or area equal to a footprint or area of the semiconductor device 100. Insulating layer 88 is formed over encapsulant 66 and conductive interconnects 56 opposite backside coating 84. Conductive layer 90 may be formed as a fan-out RDL that is coupled to interconnect structures 56 and directs electrical signals for package input/output electrical connection. Insulating layer 92 is formed over conductive layer 90 and insulating layer 88. Openings in insulating layer 92 are formed over a portion of conductive layer 90. UBMs 94 are conformally formed over insulating layer 92 and portions of conductive layer 90. One or more UBMs 94 can be partially or completely formed within a footprint of semiconductor die 34. Alternatively, one or more UBMs 94 can be formed completely or partially outside a footprint of semiconductor die 34. Bumps 96 are formed over UBMs 94 to provide package input/output (I/O) interconnects for semiconductor device 100. In an embodiment, a plurality of bumps 96 form an array of bumps or land grid array (LGA) aligned with package edges 99 or a periphery or outer profile of FOWLP 100.

The second ends 59 of conductive interconnects 56 are shown lower than the planar surface 67a of the encapsulant 66, the second ends 59 being offset from the planar surface 67a by first distance D1 that is equal to or greater than 1 μm.

The offset or distance D1 can be formed by etchant 85 when the etchant 85 etches or removes the conductive residue 83 that can be formed or placed during the grinding process. By removing the conductive residue 83, a leakage current that would otherwise be caused by the residue 83, such as during high voltage test conditions or HAST testing, can be reduced or eliminated.

Figure 4:
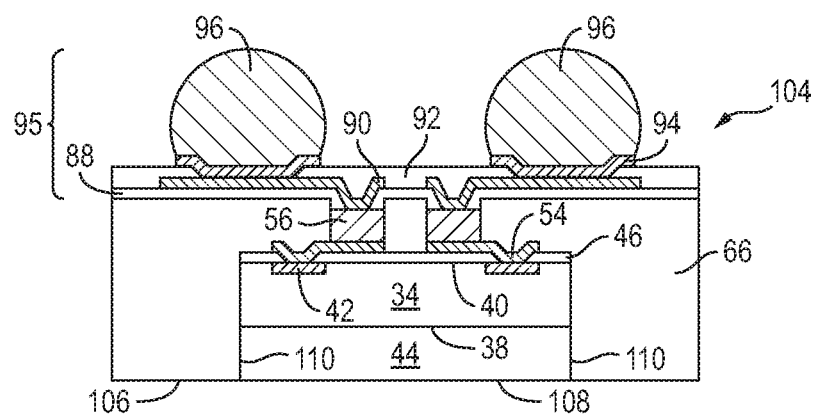

FIG. 4 shows a semiconductor device, package, or FOWLP 104 similar to semiconductor device 100 from FIG. 3. Semiconductor device 104 differs from semiconductor device 100 by the inclusion of backside coating 44 from FIG. 1B rather than backside coating 84. By forming backside coating 44 over backside 38 of semiconductor die 34 before the formation of encapsulant 66, surface 106 of encapsulant 66 is formed opposite insulating layer 88 and is substantially coplanar with surface 108 of backside coating 44 formed over semiconductor die 34. Additionally, encapsulant 66 contacts side surfaces 110 of backside coating 44 between backside 38 and surface 108, which differs from similar side surfaces of backside coating 84 in semiconductor device 100 that are left exposed with respect to encapsulant 66 in semiconductor device 100.

Figure 5:
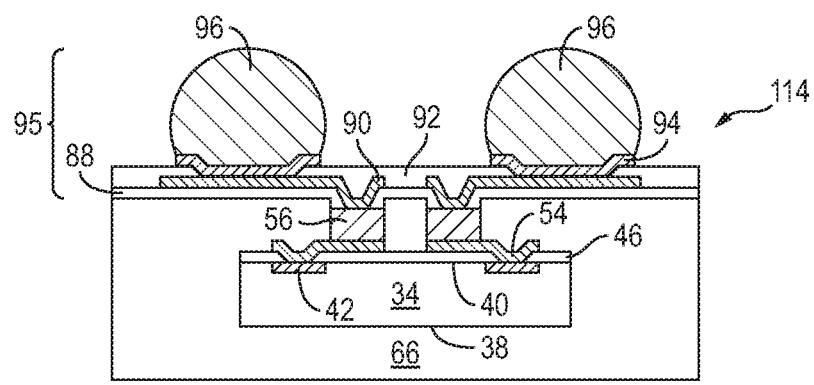

FIG. 5 shows a semiconductor device, package, or FOWLP 114 similar to semiconductor device 100 from FIG. 3. Semiconductor device 114 differs from semiconductor device 100 by the omission of backside coating 84 and by the formation of encapsulant 66. Encapsulant 66 in FIG. 5 is disposed over backside 38 of semiconductor die 34, and encapsulation of the semiconductor can by accomplished by mounting semiconductor die 34 face down during encapsulation as described above with respect to FIG. 2A.

Figure 6:
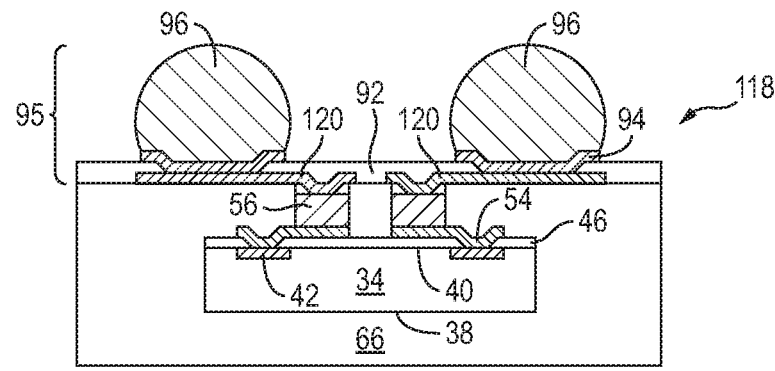

FIG. 6 shows a semiconductor device, package, or FOWLP 118 similar to semiconductor device 114 from FIG. 5. Semiconductor device 118 differs from semiconductor device 114 by the omission of insulating layer 88 and by the formation of conductive layer 120 as a fan-out RDL directly on encapsulant 66. As such, the conductive layer 120 can directly contacts, and extends across, the planar surface 67a of the encapsulant 66, as is similarly shown in FIGS. 10 and 11 with conductive layer 140. Conductive layer 120, like conductive layer 90, can be one or more layers of Al, Cu, Sn, Ni, Au, Ag, or other suitable electrically conductive material. The deposition of conductive layer 120 uses PVD, CVD, electrolytic plating, electroless plating, or other suitable process. In an embodiment, conductive layer 120 is an RDL comprising a TiW seed layer, a Cu seed layer, and Cu layer formed over the TiW seed layer and the Cu seed layer. Conductive layer 120 is part of build-up interconnect structure 95 that provides electrical interconnection between electrical interconnects 56 and UBMs 94 and bumps 96. Encapsulant 66 in FIG. 5 is disposed over backside 38 of semiconductor die 34, and encapsulation of the semiconductor die can by accomplished by mounting semiconductor die 34 face down during encapsulation as described above with respect to FIG. 2A.

Figure 7:
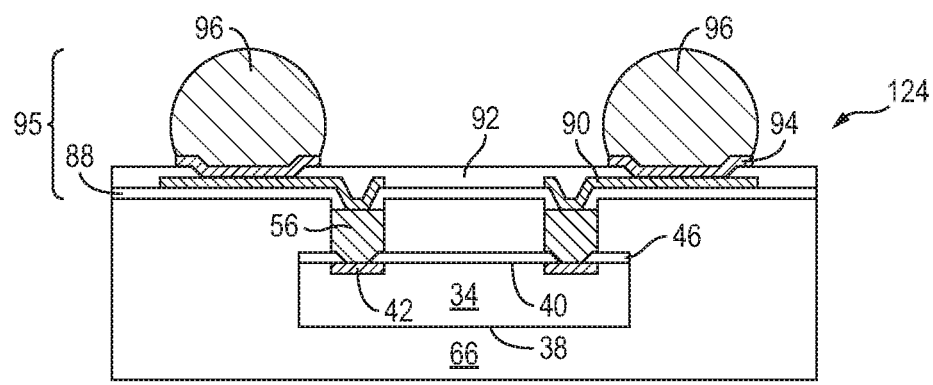

FIG. 7 shows a semiconductor device, package, or FOWLP 124, which is similar to semiconductor device 114 from FIG. 5. Semiconductor device 124 differs from semiconductor device 114 by the omission of conductive layer 54. Furthermore, instead of forming interconnect structures 56 on a fan-in RDL as shown in FIG. 5, in FIG. 7 interconnect structures or copper studs 56 are formed directly on contact pads 42. As shown in FIG. 1C, interconnect structures 56 are preferably formed at the wafer level before singulation of semiconductor wafer 30.

Figure 8:
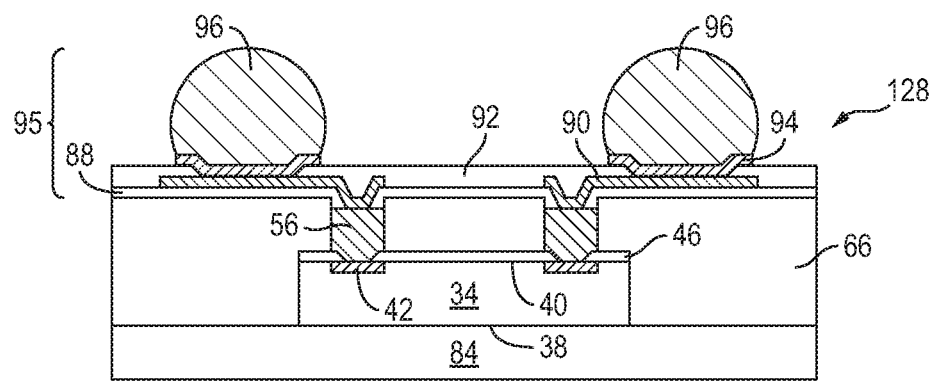

FIG. 8 shows a semiconductor device, package, or FOWLP 128, which is similar to semiconductor device 100 from FIG. 3. Semiconductor device 128 differs from semiconductor device 100 by the omission of conductive layer 54. Furthermore, instead of forming interconnect structures 56 on a fan-in RDL as shown in FIG. 3, FIG. 8 shows interconnect structures or copper studs 56 formed directly on contact pads 42, as shown in FIG. 1C.

Figure 9:
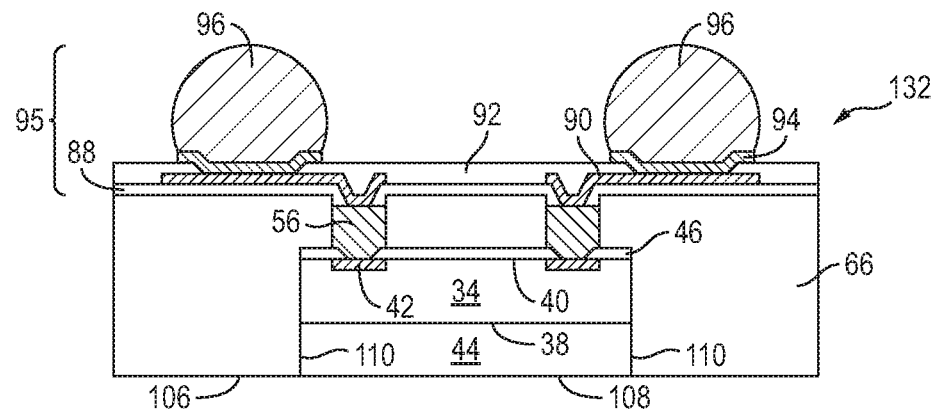

FIG. 9 shows a semiconductor device, package, or FOWLP 132, which is similar to semiconductor device 104 from FIG. 4. Semiconductor device 132 differs from semiconductor device 104 by the omission of conductive layer 54. Furthermore, instead of forming interconnect structures 56 on a fan-in RDL as shown in FIG. 4, in FIG. 9 interconnect structures or copper studs 56 are formed directly on contact pads 42, as shown in FIG. 1C, at the wafer level before singulation of semiconductor wafer 30.

Figure 10:
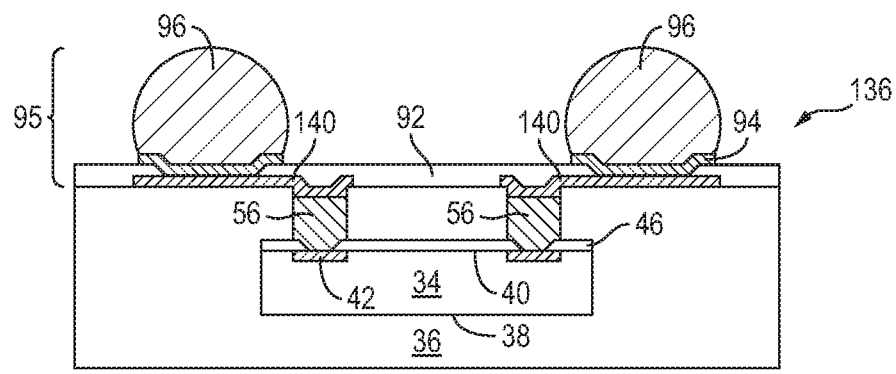

FIG. 10 shows a semiconductor device, package, or FOWLP 436, which is similar to semiconductor device 118 from FIG. 6. semiconductor device 436 differs from semiconductor device 118 by the omission of conductive layer 54. Furthermore, instead of forming interconnect structures 56 on a fan-in RDL as shown in FIG. 6, in FIG. 10 interconnect structures or copper studs 56 are formed directly on contact pads 42. As shown in FIG. 1C, interconnect structures 56 are preferably formed at the wafer level before singulation of semiconductor wafer 30 such that adaptive patterning is not required for the formation of the interconnect structures. Instead, adaptive patterning is used in the formation of a unit-specific pattern or the placement of conductive layer 140 that aligns with interconnect structures 56. Conductive layer 140 is similar to conductive layer 120 from FIG. 6, and is formed directly on encapsulant 66 instead of on an additional insulating layer such as insulating layer 88.

Figure 11:
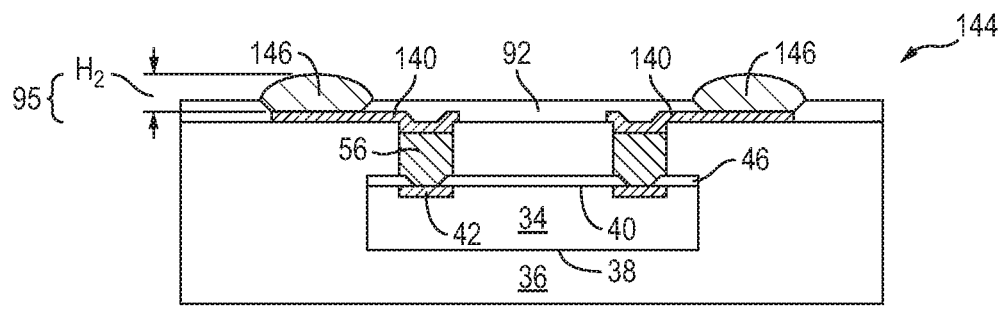

FIG. 11 shows a semiconductor device, package, or FOWLP 144, which is similar to semiconductor device 136 from FIG. 10. Semiconductor device 144 differs from semiconductor device 136 by the omission of UBMs 94 and the formation of low profile bumps 146 directly on conductive layer 140. In an embodiment, a plurality of low profile bumps 146 forms an array of bumps or LGA aligned with a periphery or outer profile of semiconductor device 144. IN some instances, a height H2 of low profile bumps 146 is in a range of 20 μm to 125 μm.

In the foregoing specification, various embodiments of the disclosure have been described. It will, however, be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:
1. A semiconductor device comprising:
a semiconductor die comprising four side surfaces and an active surface, the semiconductor die further comprising contact pads disposed over the active surface;
conductive interconnects comprising first ends coupled to the contact pads, second ends opposite the first ends, and side surfaces extending between the first ends and the second ends, the second ends of the conductive interconnects offset from the active surface by a height of at least 8 micrometers (μm);
a single encapsulant contacting the four side surfaces of the semiconductor die and side surfaces of the conductive interconnects, the single encapsulant further comprising a planar surface disposed over the active surface of the semiconductor die, the planar surface being offset from the active surface by more than the height of the conductive interconnects;

openings formed through the planar surface of the single encapsulant and extending to the second ends of the conductive interconnects, the openings comprising a depth greater than or equal to 1 µm; and a build-up interconnect layer disposed over the planar surface and comprising a fan-out redistribution layer (RDL) extending into the openings to electrically connect with the conductive interconnects.

2. The semiconductor device of claim 1, wherein the conductive interconnects comprise copper studs or redistribution layer (RDL) traces.

3. The semiconductor device of claim 1, wherein the build-up interconnect layer comprises conductive bumps coupled to the redistribution layer (RDL).

4. The semiconductor device of claim 1, wherein the planar surface is free from a conductive residue formed by grinding the single encapsulant and the conductive interconnects.

5. The semiconductor device of claim 1, further comprising a backside coating contacting a backside of the semiconductor die.

6. A method of making the semiconductor device of claim 4, further comprising:

grinding a surface of the single encapsulant to expose the conductive interconnects, to form the planar surface, and to form the conductive residue across the planar surface; and etching the conductive residue and the exposed conductive interconnects to remove the conductive residue at the planar surface and to reduce a height of the conductive interconnects to form the second ends of the conductive interconnects offset from the planar surface by a distance greater than 1 µm.

7. A semiconductor device comprising:

a semiconductor die comprising four side surfaces and an active surface, the semiconductor die further comprising contact pads disposed over the active surface;

conductive interconnects comprising first ends coupled to the contact pads and second ends opposite the first ends;

a single encapsulant contacting the four side surfaces of the semiconductor die and side surfaces of the conductive interconnects, the single encapsulant further comprising a planar surface disposed over the active surface of the semiconductor die, the planar surface being offset from the active surface by more than the height of the conductive interconnects;

openings formed through the planar surface of the single encapsulant and extending to the second ends of the conductive interconnects, the openings comprising a depth greater than or equal to 1 micrometers (µm); and a build-up interconnect layer disposed over the planar surface and comprising a fan-out redistribution layer (RDL) extending into the openings to electrically connect with the conductive interconnects.

8. The semiconductor device of claim 7, wherein the conductive interconnects comprise copper studs or redistribution layer (RDL) traces.

9. The semiconductor device of claim 7, wherein the build-up interconnect layer comprises conductive bumps coupled to the redistribution layer (RDL).

10. The semiconductor device of claim 7, wherein the planar surface is free from a conductive residue formed by grinding the single encapsulant and the conductive interconnects.

11. The semiconductor device of claim 7, further comprising a backside coating contacting a backside of the semiconductor die.

12. A method of making the semiconductor device of claim 10, further comprising:

grinding a surface of the single encapsulant to expose the conductive interconnects, to form the planar surface, and to form the conductive residue across the planar surface; and etching the conductive residue and the exposed conductive interconnects to remove the conductive residue at the planar surface and to reduce a height of the conductive interconnects to form the second ends of the conductive interconnects offset from the planar surface by a distance greater than 1 µm.

13. The semiconductor device of claim 9, wherein a back surface of the semiconductor die is exposed at a periphery of the semiconductor device.

14. A semiconductor device comprising:

a semiconductor die comprising an active surface and contact pads disposed over the active surface;

conductive interconnects comprising first ends coupled to the contact pads and second ends opposite the first ends;

an encapsulant comprising a planar surface disposed over the active surface of the semiconductor die, the encapsulant comprising openings with a distance greater than or equal to 1 micrometer (µm) that extend from the planar surface of the encapsulant to the conductive interconnects; and a build-up interconnect layer disposed over the planar surface and comprising a fan-out redistribution layer (RDL) extending across the planar surface of the encapsulant and into the openings to electrically connect with the conductive interconnects.

15. The semiconductor device of claim 14, wherein the conductive interconnects comprise copper studs or redistribution layer (RDL) traces.

16. The semiconductor device of claim 14, wherein a back surface of the semiconductor die is exposed at a periphery of the semiconductor device.

17. The semiconductor device of claim 14, wherein the planar surface is free from a conductive residue formed by grinding the encapsulant and the conductive interconnects.

18. The semiconductor device of claim 14, further comprising a backside coating contacting a backside of the semiconductor die.

19. A method of making the semiconductor device of claim 17, further comprising:

grinding a surface of the encapsulant to expose the conductive interconnects, to form the planar surface, and to form the conductive residue across the planar surface; and etching the conductive residue and the exposed conductive interconnects to remove the conductive residue at the planar surface and to reduce a height of the conductive interconnects to form the second ends of the conductive interconnects offset from the planar surface by a distance greater than 1 µm.

20. The semiconductor device of claim 14, wherein:

the semiconductor die comprises four side surfaces;

the conductive interconnects comprise side surfaces extending from the first ends to the second ends; and the encapsulant contacts the four side surfaces of the semiconductor die and the side surfaces of the conductive interconnects.

* * * * *